United States Patent

Strumolo et al.

Patent Number: 5,877,968
Date of Patent: Mar. 2, 1999

[54] METHOD FOR AUTOMOTIVE VEHICLE BODY SHAPE DESIGN

[75] Inventors: Gary Steven Strumolo, Beverly Hills; Laurine Joyce Leep-Apolloni, Royal Oaks, both of Mich.

[73] Assignee: Ford Global Technologies, Inc., Dearborn, Mich.

[21] Appl. No.: 763,387

[22] Filed: Dec. 16, 1996

[51] Int. Cl.$^6$ .................................................. G06F 17/50
[52] U.S. Cl. .................................. 364/512; 364/578
[58] Field of Search ............................ 364/512, 578

[56] References Cited

U.S. PATENT DOCUMENTS 5,458,304  10/1995  Gilbert .............................. 244/90 B
5,544,524  8/1996  Huyer et al. ............................ 73/147

OTHER PUBLICATIONS

"Method of simulating structural dynamics" by A. Clymer, Simulation—The Dynamic Modeling of Ideas and Systems with Computers, McGraw–Hill Book Company, 1968, pp. 49–64.

"Modal simulation of unidirectional fluid dynamics" by A Childs, Simulation–The Dynamic Modeling of Ideas and Systems with Computers, McGraw–Hill Book Company, 1968, pp. 133–143.

"Dynamics of a rotating space station" by W. Polstorff, Simulation—The Dynamic Modeling of Ideas and Systems with Computers. McGraw–Hill Book Company, 1968, pp. 144–159.

"A Method for Invere Aerofoil and Cascade Design by Surface Vorticity", Gas Turbine Division of the ASME, R.I. Lewis (82–GT–1540).

*Primary Examiner*—Vincent N. Trans
*Attorney, Agent, or Firm*—David B. Kelley

[57] ABSTRACT

A method for designing an automotive vehicle body shape having fixed and free boundaries to meet a pre-specified velocity or pressure distribution for a portion of the vehicle body migrates a set of vortex elements, whose strengths are related to the desired velocity and pressure distributions, until they reach spatial positions consistent with the desired velocity and pressure profile. A desired velocity and pressure profile is specified for a first portion and a shape is specified for a second portion of the vehicle body, and an initial shape for the first portion is estimated having a free surface cross-section, which is divided into free surface elements. Free surface vorticies are assigned in one-to-one correspondence to the free surface elements, and fixed surface vorticies in one-to-one correspondence with the fixed surface elements are determined. For each of the free surface elements, an x-axis velocity component and a y-axis velocity component is determined based upon the free surface vorticies and the fixed surface vorticies. These velocity components are then used to realign the planar orientation of each of the plurality of free surface elements. Determination of new x-axis and y-axis velocity components and realignment of the free surface cross-section continues until each of the free surface elements is within a predetermined tolerance.

11 Claims, 5 Drawing Sheets

1

METHOD FOR AUTOMOTIVE VEHICLE BODY SHAPE DESIGN

FIELD OF THE INVENTION

The present invention relates to shape design for automotive vehicles in general, and more specifically to a method for designing an exterior automotive body shape with both fixed and free boundary shapes to produce a desired velocity and pressure profile over a predetermined portion of the surface.

BACKGROUND OF THE INVENTION

Most computational fluid dynamics (CFD) design procedures follow a direct method, that is, the shape of an object is specified and the CFD design procedure computes a velocity or pressure profile along its surface. This approach is reactive, instead of proactive, since an aesthetically pleasing body shape choice may be aerodynamically inefficient and produce an undesirable velocity and pressure profile. Another body shape design approach is an inverse method which is essentially an iterative use of the direct method. This type of inverse method uses successive guesses to achieve a final shape. At each iteration, the latest shape is analyzed using the direct method and its actual surface velocity or pressure distribution is compared to a desired one. The error is used to construct a correction to the geometry for the next iteration. This approach is one step above trial-and-error, however, with the "corrections" hopefully providing some rationale for making shape changes.

A true inverse method which utilizes a surface vorticity model for designing a shape to meet a desired velocity and pressure profile is presented in the article "A Method for Inverse Aerofoil and Cascade Design by Surface Vorticity", Lewis, R. L., ASME Paper No. 82-GT-154 (1982). This method, however, along with the previously discussed methods, do not address design of a vehicle body shape when two portions of the body surface are in close proximity, and in which one portion has a relatively fixed shape and the other portion has a free shape, that is, one which is changeable. Thus, a vehicle shape design method is needed which provides a vehicle body shape having desired velocity and pressure distribution over separate portions of the body surface having both fixed and free shapes.

SUMMARY OF THE INVENTION

The present provides an inverse method for designing an automotive vehicle body shape to meet a pre-specified velocity or pressure distribution for a portion of the vehicle body. The method works by migrating a set of vortex elements, whose strengths are related to the desired velocity and pressure distributions, until they reach spatial positions consistent with the desired velocity and pressure profile. The method is particularly useful for portions of the vehicle body surface where two types of boundaries are required: free and fixed. Free boundaries are those where the velocity/pressure is known, but the shape is not known. On the other hand, fixed boundaries are those where the shape is prescribed, but the velocity/pressure distribution is not known. The method can be used in various areas for vehicle body design, including rear end spoiler/deck design, side mirror shroud shape design, and front end vehicle shape studies.

The first step in the method is specifying a desired velocity and pressure profile over a first portion and a second portion of the vehicle body. An initial shape for the first portion is then estimated having a free surface cross-section, which is divided into a plurality of free surface elements. The free surface cross-section is then further divided into an upper half and a lower half. A plurality of free surface vorticies are then assigned in one-to-one correspondence to each of the plurality of free surface elements. The fixed surface cross-section is next divided into a plurality of fixed surface elements, and a base surface cross-section is constructed and appended to the fixed surface cross-section so as to provide a composite surface having a closed cross-section. A potential flow over the composite surface is then determined to produce a plurality of fixed surface vorticies in one-to-one correspondence with the plurality of fixed surface elements. For each of the plurality of free surface elements, an x-axis velocity component and a y-axis velocity component are determined based upon the plurality of free surface vorticies and the plurality of fixed surface vorticies. These velocity components are then used to realign the planar orientation of each of the plurality of free surface elements. The upper half and the lower half are connected so that the free surface cross-section is closed to produce an adjusted free surface cross-section. Determination of new x-axis and y-axis velocity components and realignment of the free surface cross-section continues until each of the plurality of free surface elements is within a predetermined tolerance so as to produce a predetermined velocity and pressure profile over the first portion and the second portion when exposed to a predetermined flow of air therearound.

An advantage of the present invention is a vehicle body shape design method in which the final shape is reached with only a few dozen iterations, each of which is computed directly.

Another advantage is a robust vehicle body shape design method in which a desired shape can be quickly obtained even when an initial shape is far from the desired shape.

A feature of the present invention is a vehicle body shape design method in which a set of vortex elements, whose strengths are related to a desired velocity and pressure distribution, are migrated until reaching consistent spatial positions.

BRIEF DESCRIPTION OF THE DRAWINGS

These and other objects, advantages, and features of the present invention will be apparent to those skilled in the vehicle body arts upon reading the following description with reference to the accompanying drawings, in which.

DETAILED DESCRIPTION OF THE PREFERRED EMBODIMENT

Figure 1:
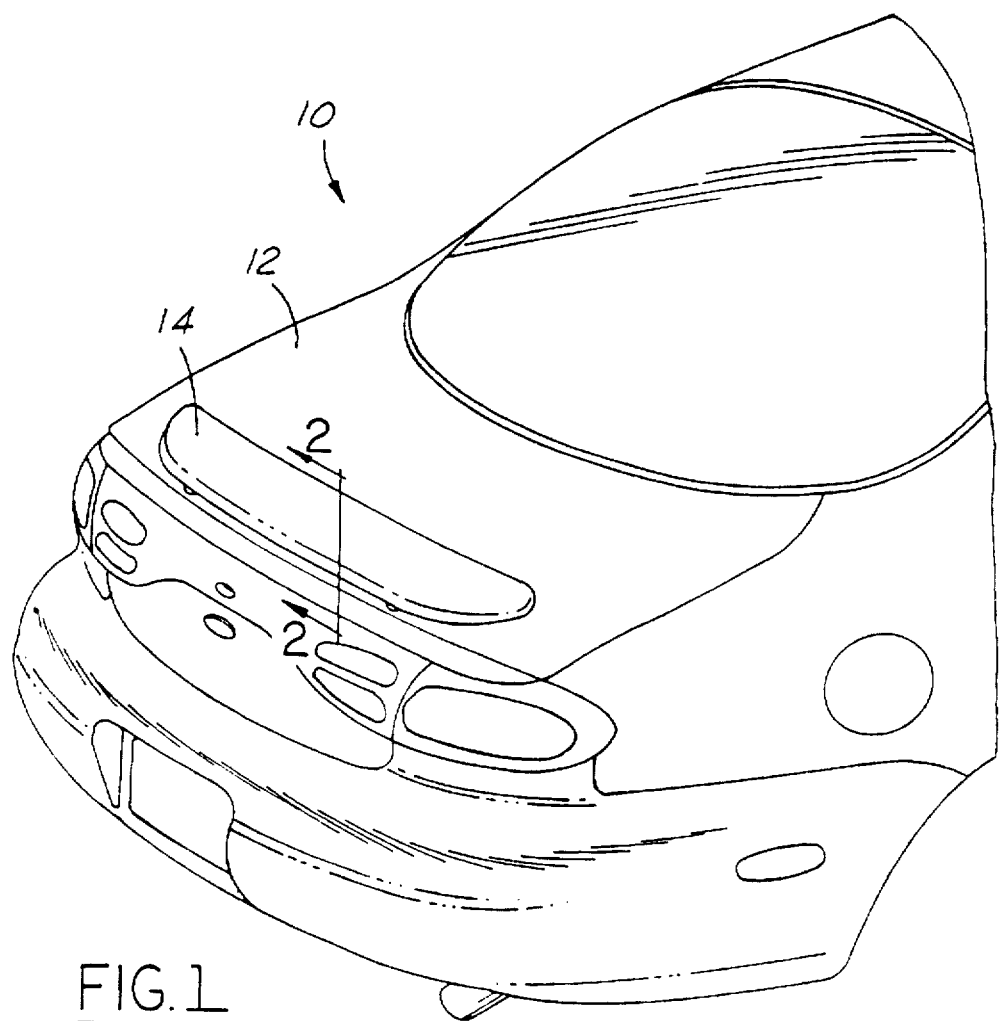
FIG. 1 is a rear perspective view of an automotive vehicle having a rear deck with a spoiler mounted thereon having a shape designed to produce a desired velocity\pressure profile by using the method of the present invention.

Turning now to the drawings, and in particular to FIG. 1 thereof, an automotive vehicle 10 has a rear deck 12 with a spoiler 14 mounted thereon. As those skilled in the art will recognize, air flowing past the deck 12 and the spoiler 14 will produce a velocity\pressure profile therearound, such as when the vehicle 10 is driven. The shape of spoiler 14, in conjunction with the deck 12 which usually has a fixed shape, is thus important for achieving a desired, predetermined velocity\pressure profile. Such a velocity/pressure profile may help improve vehicle fuel economy and handling, for example.

Figure 2:
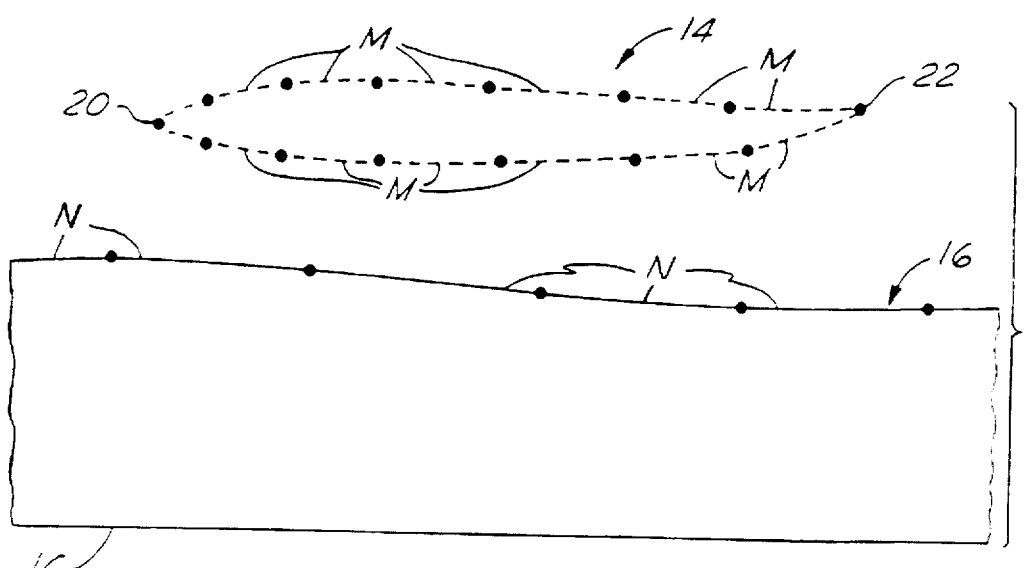
FIG. 2 is a cross-sectional view taken through line 2—2 of FIG. 1.

The shape of the spoiler 14 must be changed to achieve the desired profile when it lies next to the rear deck 12, which has a fixed shape and position. Thus, in terms of fluid dynamics, the vehicle body shape during the design process has mixed boundaries, that is, boundaries which can be divided into two classes. The first class of boundaries are called free surfaces, where the velocity/pressure distribution is given but the shape is to be determined. The spoiler 14 falls into this class. The second class of boundaries has fixed surfaces, that is, the shape is known but the velocity/pressure distribution is unknown, such as the rear deck 12. As seen in FIG. 2, a base surface 16 is added to the fixed surface to provide a closed surface over which potential flow can be determined, as is further discussed below.

Figure 3:
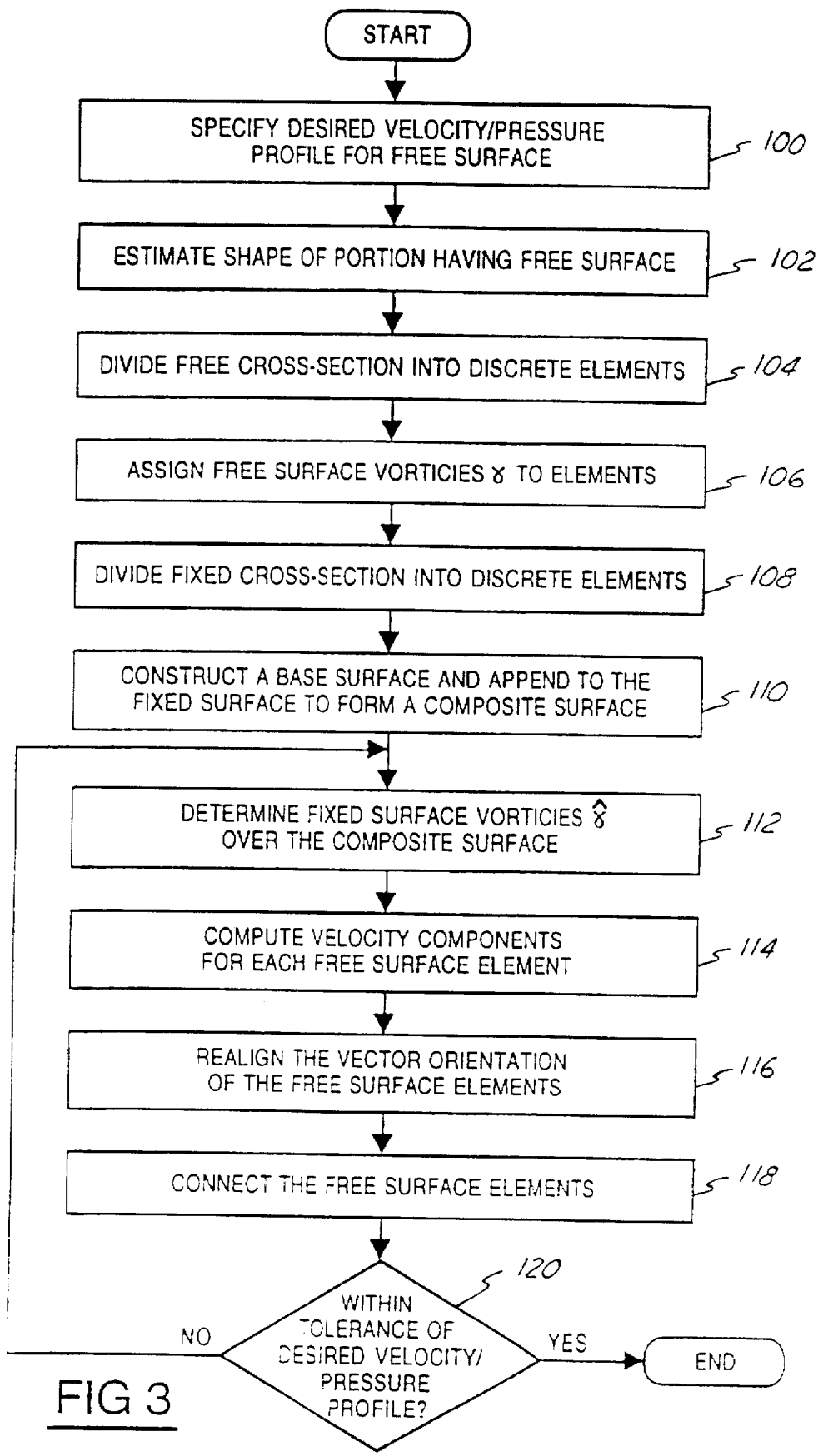
FIG. 3 is a flowchart showing an embodiment of the vehicle shape design method according to the present invention.

With reference to FIG. 3, the method of the present invention is shown in flowchart form. In box 100, a desired velocity and pressure profile is specified over the deck 12 and the spoiler 14. Those skilled in the art will understand that the deck 12 and the spoiler 14 are illustrative shapes only, and that the present invention is not intended to be limited to such shapes but can also be used for other vehicle shapes in which both free and fixed boundaries exist. For consistency with the drawings, the deck 12 and the spoiler 14 will be used in the following paragraphs to correspond with a portion of the vehicle having a fixed boundary surface and a portion of the vehicle having a free boundary surface, respectively. The deck 12 is thus equivalent to the second portion as used in the claims, and the spoiler 14 is equivalent to the first portion as used in the claims.

For purposes of this disclosure, air flowing over the deck 12 and the spoiler 14 is assumed to be potential-like. Pressure, represented by the dimensionless coefficient $C_p$, and velocity are thus related through Bernoulli's equation as follows:

$$C_p = 1 - (V/V_\infty)^2$$

where $V$ = a local velocity over the deck 12 and spoiler 14, and
$V$ = the free stream velocity over the deck 12 and the spoiler 14.

Thus, $C_p$ equals one at stagnation points ($V=0$) and zero when the local velocity equals that of the free stream. Higher local velocities yield negative $C_p$ values. Because of this relationship, it can be assumed that a desired velocity distribution is present over the deck 12 and the spoiler 14. A surface velocity $v_s$ is chosen as a function of distance along the free surface of spoiler 14, for example, from a leading edge 20 to a trailing edge 22 (FIG. 2).

Continuing with FIG. 3, an initial shape for the spoiler 14, which has a free surface cross-section, is then estimated in box 102. In box 104, the spoiler 14 is divided into a plurality of free surface elements M (FIG. 2). The spoiler 14 is then preferably further be divided into an upper half and a lower half. Each of the free surface elements M is then permanently assigned a free surface vorticity $\gamma$ equal to the surface velocity $v_s$ there, in one-to-one correspondence with the free surface elements M (box 106). The deck 12 is next divided into a plurality of fixed surface elements N (box 108), and the base surface cross-section 16 is constructed and appended to the deck 12 (box 110) so as to provide a composite surface 18 having a closed cross-section (FIG. 2). In box 112, a potential flow over the composite surface 18 is determined, using a boundary integral method known in the art, to produce a plurality of fixed surface vorticies $\gamma'$ for the deck 12 in one-to-one correspondence with the fixed surface elements N. The fixed surface vorticies are preferably determined by forming the union $\Gamma_{fixed} \cup \Gamma_{base}$, where $\Gamma_{fixed}$ are the fixed surface vorticies and $\Gamma_{base}$ are the base surface vorticies.

For each of the free surface elements M, an x-axis velocity component and a y-axis velocity component are then determined (box 114) based upon the plurality of the free surface vorticies and the plurality of fixed surface vorticies. The x-axis and y-axis velocity components, $u_m$, $v_m$, respectively, at each element M includes the influence of all other free surface elements, the influence of fixed elements N, and the influence of the external free stream flow, as follows:

$$u_m = U_\infty + \frac{1}{2\pi} \sum_{\substack{n=1 \\ n \neq m}}^{M} \frac{-(y_n - y_m)\gamma(s_n)\Delta s_n}{(x_n - x_m)^2 + (y_n - y_m)^2} +$$

$$\frac{1}{2\pi} \sum_{n=1}^{N} \frac{-(\hat{y}_n - y_m)\hat{\gamma}(\hat{s}_n)\Delta \hat{s}_n}{(\hat{x}_n - x_m)^2 + (\hat{y}_n - y_m)^2} + \Delta q_m \cos\beta_m$$

$$v_m = V_\infty + \frac{1}{2\pi} \sum_{\substack{n=1 \\ n \neq m}}^{M} \frac{(x_n - x_m)\gamma(s_n)\Delta s_n}{(x_n - x_m)^2 + (y_n - y_m)^2} +$$

$$\frac{1}{2\pi} \sum_{n=1}^{N} \frac{(\hat{x}_n - x_m)\hat{\gamma}(\hat{s}_n)\Delta \hat{s}_n}{(\hat{x}_n - x_m)^2 + (\hat{y}_n - y_m)^2} + \Delta q_m \sin\beta_m$$

where $u_m$ and $v_m$ are the x-axis velocity and y-axis velocity, respectively, ($U_\infty$, $V_\infty$) is the external free stream flow, (x,y) are points on the free surface, ($\hat{x}$,$\hat{y}$) are points on the composite surface, g is vorticity on the free surface, $\gamma$ is vorticity on the composite surface, $\Delta s_m$ is the length of a free surface element $s_m$, and $\Delta q_m$ is the self-induced convection velocity of element m, given in terms of the profile slope $\beta m$ by $$\Delta q_m = \frac{\gamma(s_m)}{8\pi}(\beta_{m-1} - \beta_{m+1}).$$

Figure 4:
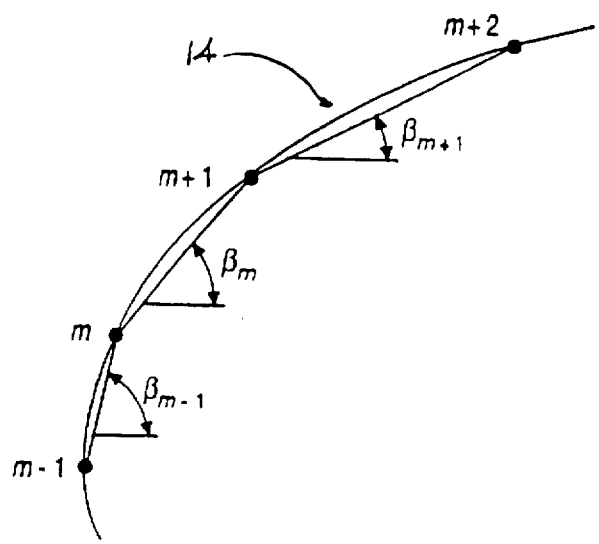
FIG. 4 is a sectional view of a shape of a portion of a vehicle showing a convention for the profile slope.

The profile slope $\beta m$ is measured from in a predetermined convention, for example clockwise from the horizontal as seen in FIG. 4.

These velocity components are then used to realign the planar orientation of each of the plurality of free surface elements (box 116). The upper and lower surfaces of the spoiler 14 are realigned by treating them as flexible chains with rigid, straight-line links, the links being the free surface elements M. Each link is aligned to be parallel to the velocity direction at that point. This realignment proceeds along both the upper and lower halves from the leftmost point of the profile, that is, the leading edge 20, which is held fixed throughout the iterations. The upper half and the lower half are then connected so that the free surface cross-section of the spoiler 14 is closed to produce an adjusted free surface cross-section for the spoiler 14 (box 118). Determination of new x-axis and y-axis velocity components and realignment of the free surface cross-section continues until each the velocities of each of the free surface elements M is within a predetermined tolerance (box 120) so as to produce the predetermined velocity and pressure profile over the deck 12 and the spoiler 14 when exposed to a predetermined flow of air therearound.

Numerical round-offs in the velocity calculations may cause the trailing edge computed by marching along the upper surface to be different from that obtained by the lower surface. Since the shape of the free surface of the spoiler 14 must be closed to obtain a converged solution, a two-part correction is preferably applied at this point. In the first part of the correction, the upper and lower surfaces are rotated so that the lines connecting the fixed point to the two trailing edge points coincide. The surfaces are stretched or shrunk as required so that the distance from the leading edge to the trailing edge is maintained. This distance can be maintained by scaling the free surface elements M. With this process of stretching/shrinking of the spoiler 14, the initial estimate need not be a small perturbation from the final shape.

To assist in rapid convergence of the design, a relaxation factor $f$ may be used. This factor, between zero and one, regulates how much of a newly-computed shape is to be used after an iteration, i.e., $$\text{shape}_{t+1} = (1-f)*\text{shape}_t + f*\text{shape}_{iterate}.$$

where $\text{shape}_{t+1}$ is the shape of the first portion resulting from a combination of the current and proposed shapes;

$\text{shape}_t$ is the current shape of the first portion; and $\text{shape}_{iterate}$ is the proposed shape of the first portion.

If $f$ is one, then a newly-computed shape is used in its entirety as the new estimate. If $f$ is less than one, the new shape is a combination of the previous shape and the newly-computed iterate. The relaxation factor $f$ is selected to maximize the convergence of the iterations. This can be done dynamically through user intervention or by applying a mathematical procedure. User intervention is preferably accomplished by manual input of a relaxation factor to a computer program, such as a computer spreadsheet.

At the end of a step through boxes 116–120, the velocity is then computed to be $$v_{sm} = 2\sqrt{u_m^2 + v_m^2}.$$

where $v_{sm}$ is the slip velocity on element m of the first portion;

$u_m$ is the x-axis component of the velocity on element m;

$v_m$ is the y-axis component of the velocity on element m.

For the iterations to stop this should agree with the desired velocity distribution to within a predetermined tolerance. Preferably, the final shape should have it's velocity/pressure distribution computed directly and compared to the desired velocity/pressure distribution as a final check.

Figure 5:
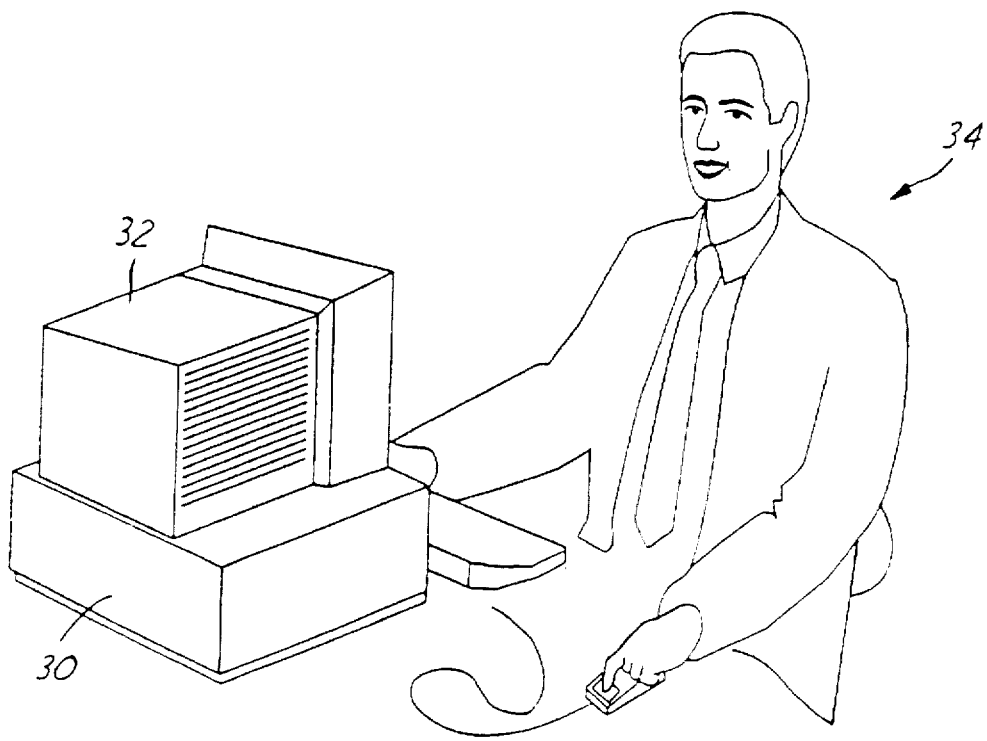
FIG. 5 is a perspective view showing a designer at a computer terminal upon which the method of the present invention can be operated and displayed.
Figure 6:
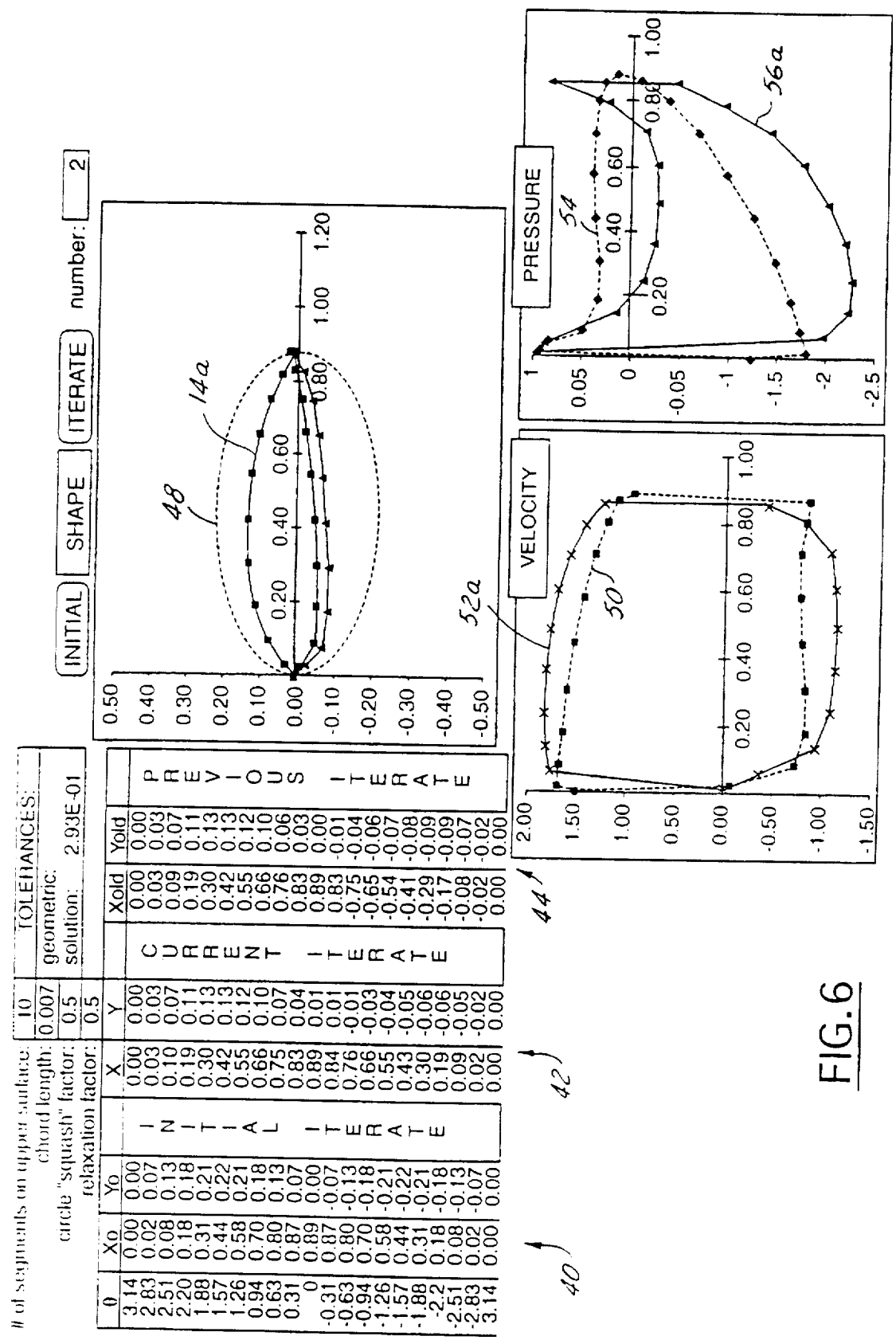
FIGS. 6 and 7 are screen views of a display showing the changing shape of a spoiler during design according to a method of the present invention.
Figure 7:
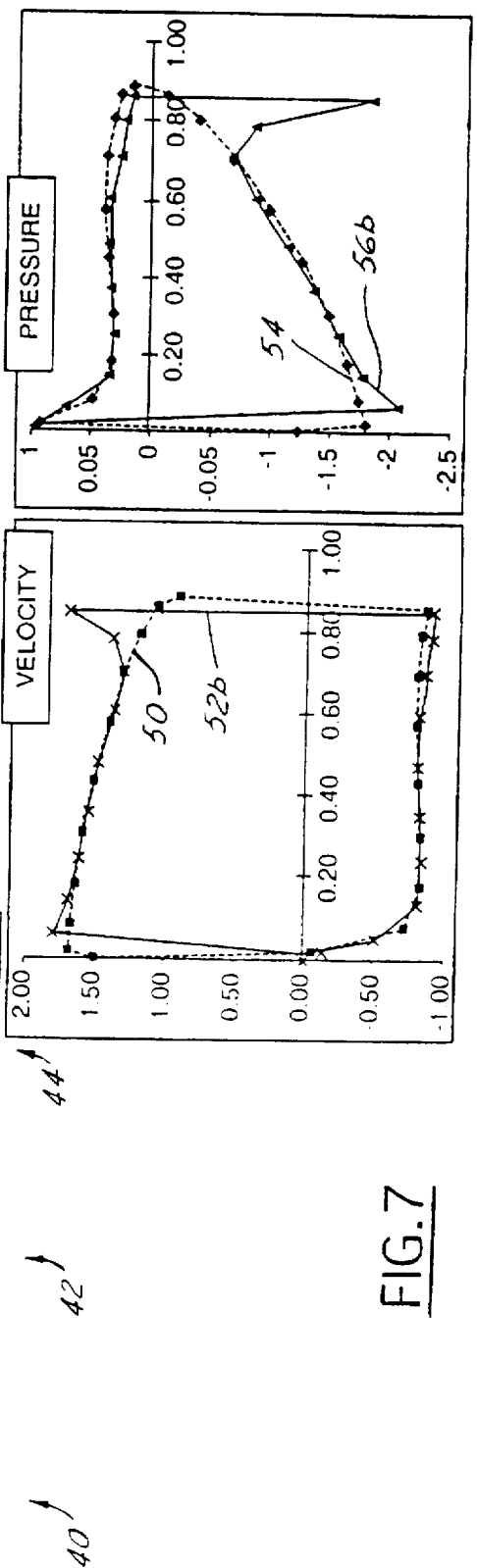

In a preferred embodiment of the present invention, portions of the method can be carried out on an electronic computer 30, having a monitor 32, by a vehicle designer 34 (FIG. 5). Preferably, a computer program, such as a spreadsheet program, can be modified to display the shape of the spoiler 14, along with various attributes, on the monitor 32 as the shape changes. The designer can step through the program while viewing spoiler 14 shape changes, if desired, as seen in FIG. 6 and 7. In the screen view of FIG. 6, a spoiler 14 shape is show after two iterations. The upper left area shows columns 40, 42, 44 having free surface element lengths corresponding to the initial estimates, the current shape, and the previous shape, respectively. The shape of the spoiler 14a is displayed, as is the initial estimate 48 for the shape. The desired velocity profile 50, the current velocity profile 52a, the desired pressure profile 54, and the current pressure profile 56a are also shown. FIG. 7 shows the shape of the spoiler 14b after 20 iterations. The current velocity profile 52b and current pressure profile 56b are quite close to the desired velocity profile 50 and the desired pressure profile 54, respectively.

The method of the present invention as described results in the determination of the shape for a free surface with a prescribed velocity/pressure distribution along it as well as the determination of this distribution along the fixed portion of the boundary. This new procedure enables vehicle designers to consider more relevant problems such as the determination of a rear spoiler shape in the vicinity of a prescribed rear deck shape and a side mirror shroud shape in the neighborhood of the A-Pillar and side glass, as well as other mixed boundary shapes.

Although the preferred embodiment of the present invention has been disclosed, various changes and modifications may be made without departing from the scope of the invention as set forth in the appended claims.

We claim:

1. A method for designing an automotive vehicle body having a first portion and a second portion with a fixed surface cross-section, the method comprising the steps of:

(a) specifying a desired velocity and pressure profile over the first portion and the second portion of the vehicle body;

(b) estimating a shape for the first portion having a free surface cross-section;

(c) dividing the free surface cross-section into a plurality of free surface elements;

(d) assigning a plurality of free surface vorticies in one-to-one correspondence to each of the plurality of free surface elements;

(e) dividing the fixed surface cross-section into a plurality of fixed surface elements;

(f) constructing a base surface cross-section and appending said base surface cross-section to the fixed surface cross-section so as to provide a composite surface having a closed cross-section;

(g) determining a potential flow over the composite surface to produce a plurality of fixed surface vorticies in one-to-one correspondence with the plurality of fixed surface elements;

(h) determining an x-axis velocity component and a y-axis velocity component for each of the plurality of free surface elements based upon the plurality of the free surface vorticies and the plurality of fixed surface vorticies;

(i) realigning the planar orientation of each of the plurality of free surface elements to correspond with the x-axis velocity component and the y-axis velocity thereof so as to produce an adjusted free surface cross-section; and (j) repeating steps (h) and (i) until the x-axis velocity component and the y-axis velocity of each of the plurality of free surface elements is within a predetermined tolerance so to produce the predetermined velocity and pressure profile over the first portion and the second portion when exposed to a predetermined flow therearound.

2. A method according to claim 1 wherein the potential flow over the composite surface in step (g) is determined by forming the union $\Gamma_{fixed} \cup \Gamma_{base}$, where $\Gamma_{fixed}$ are the fixed surface vorticies and $\Gamma_{base}$ are the base surface vorticies.

3. A method according to claim 2 wherein a boundary integral formulation is used to obtain the fixed surface vorticies.

4. A method according to claim 1 further including the step of displaying the adjusted free surface cross-section in step (i) on a video display device.

5. A method according to claim 4 wherein steps (h)–(j) are conducted on a computer so as to allow a designer an opportunity to observe the adjusted free surface cross-section and change the shape thereof.

6. A method for designing an automotive vehicle body having a first portion and a second portion with a fixed surface cross-section, the method comprising the steps of:

(a) specifying a desired velocity and pressure profile over the first portion and the second portion of the vehicle body;

(b) estimating a shape for the first portion having a free surface cross-section;

(c) dividing the free surface cross-section into a plurality of free surface elements, and further dividing the free surface cross-section into an upper half and a lower half;

(d) assigning a plurality of free surface vorticies in one-to-one correspondence to each of the plurality of free surface elements;

(e) dividing the fixed surface cross-section into a plurality of fixed surface elements;

(f) constructing a base surface cross-section and appending said base surface cross-section to the fixed surface cross-section so as to provide a composite surface having a closed cross-section;

(g) determining a potential flow over the composite surface to produce a plurality of fixed surface vorticies in one-to-one correspondence with the plurality of fixed surface elements;

(h) determining an x-axis velocity component and a y-axis velocity component for each of the plurality of free surface elements based upon the plurality of the free surface vorticies and the plurality of fixed surface vorticies;

(i) realigning the planar orientation of each of the plurality of free surface elements so as to correspond to the x-axis velocity component and the y-axis velocity thereof;

(j) connecting the upper half and the lower half so that the free surface cross-section is closed so as to produce an adjusted free surface cross-section;

(k) repeating steps (g) through (j) until the x-axis velocity component and the y-axis velocity of each of the plurality of free surface elements is within a predetermined tolerance so as to produce the predetermined velocity and pressure profile over the first portion and the second portion when exposed to a predetermined flow of air therearound.

7. A method according to claim 6 wherein step (j) is comprised of the steps of:

(1) rotating the upper section and the lower section about a fixed point on a first end of each of the upper section and the lower section until a second end of each of the upper section and the lower section coincide; and (2) adjusting the length of each of the plurality of free surface elements so that a distance between the fixed point and a trailing point of on the second end is maintained.

8. A method according to claim 7 and further including the step, after step (j), of using a relaxation factor to determine the amount of the adjusted free surface cross-section to use in a next iteration.

9. A method according to claim 8 wherein the relaxation factor, $f$ is used as follows:

$$shape_{i+1} = (1-f)^* shape_i + f^* shape_{iterate}$$

where $shape_{i+1}$ is the shape of the first portion resulting from a combination of the current and proposed shapes;

$shape_i$ is the current shape of the first portion; and $shape_{iterate}$ is the proposed shape of the first portion.

10. A method according to claim 6 and further including the step of computing a desired velocity in step (k) for each of the plurality of free surface elements as follows:

$$v_{sm} = 2 \sqrt{u_m^2 + v_m^2} \ .$$

where $v_{sm}$ is the slip velocity on element m of the first portion;

$u_m$ is the x-axis component of the velocity on element m;

$v_m$ is the y-axis component of the velocity on element m.

11. A method according to claim 6 wherein in step(h) the x-axis velocity component and a y-axis velocity for each of the plurality of free surface elements is determined as follows:

$$u_m = U_\infty + \frac{1}{2\pi} \sum_{\substack{n=1 \\ n \neq m}}^{M} \frac{-(y_n - y_m)\gamma(s_n)\Delta s_n}{(x_n - x_m)^2 + (y_n - y_m)^2} +$$

$$\frac{1}{2\pi} \sum_{n=1}^{N} \frac{-(\hat{y}_n - y_m)\hat{\gamma}(\hat{s}_n)\Delta \hat{s}_n}{(\hat{x}_n - x_m)^2 + (\hat{y}_n - y_m)^2} + \Delta q_m \cos\beta_m$$

$$v_m = V_\infty + \frac{1}{2\pi} \sum_{\substack{n=1 \\ n \neq m}}^{M} \frac{(x_n - x_m)\gamma(s_n)\Delta s_n}{(x_n - x_m)^2 + (y_n - y_m)^2} +$$

$$\frac{1}{2\pi} \sum_{n=1}^{N} \frac{(\hat{x}_n - x_m)\hat{\gamma}(\hat{s}_n)\Delta \hat{s}_n}{(\hat{x}_n - x_m)^2 + (\hat{y}_n - y_m)^2} + \Delta q_m \sin\beta_m$$

where $u_m$ and $v_m$ are the x-axis velocity and y-axis velocity, respectively, $(U_\infty, V_\infty)$ is the external free stream flow, $(x,y)$ are points on the free surface, $(\hat{x}, \hat{y})$ are points on the composite surface, g is vorticity on the free surface, $\gamma$ is vorticity on the composite surface, $\Delta s_m$ is the length of a free surface element $s_m$, and $\Delta q_m$ is the self-induced convection velocity of element m, given in terms of the profile slope $\beta_m$ by $$\Delta q_m = \frac{\gamma(s_m)}{8\pi} (\beta_{m-1} - \beta_{m+1}).$$

* * * * *